United States Patent
Lee

(10) Patent No.: US 9,607,863 B1
(45) Date of Patent: Mar. 28, 2017

(54) INTEGRATED CIRCUIT PACKAGE WITH VACANT CAVITY

(71) Applicant: Altera Corporation, San Jose, CA (US)

(72) Inventor: Myung June Lee, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 199 days.

(21) Appl. No.: 13/963,948

(22) Filed: Aug. 9, 2013

(51) Int. Cl.
*H01L 21/56* (2006.01)
*H01L 25/065* (2006.01)
*H01L 25/00* (2006.01)

(52) U.S. Cl.
CPC ........ *H01L 21/563* (2013.01); *H01L 25/0657* (2013.01); *H01L 25/50* (2013.01)

(58) Field of Classification Search
CPC .. H01L 21/563; H01L 23/315; H01L 23/3107
USPC ................ 438/106, 107, 124, 127; 257/713, 257/777–779; 3/106, 107, 124, 127
See application file for complete search history.

(56) References Cited

U.S. PATENT DOCUMENTS

| | | | |
|---|---|---|---|
| 6,000,924 A | 12/1999 | Wang et al. | |
| 6,038,136 A | 3/2000 | Weber | |
| 6,157,086 A | 12/2000 | Weber | |
| 6,495,083 B2 | 12/2002 | Weber | |
| 6,560,122 B2 | 5/2003 | Weber | |
| 6,979,600 B2 | 12/2005 | Brandenburger | |
| 8,535,981 B2 | 9/2013 | Ko et al. | |
| 2005/0145846 A1* | 7/2005 | Brandenburger | 257/71 |
| 2005/0199991 A1* | 9/2005 | Chao et al. | 257/686 |
| 2008/0176362 A1* | 7/2008 | Sengupta | H01L 21/563 438/123 |
| 2009/0091041 A1* | 4/2009 | Shen et al. | 257/777 |
| 2009/0321903 A1* | 12/2009 | Shinogi | B81C 1/00269 257/684 |
| 2010/0013032 A1* | 1/2010 | Oppermann et al. | 257/415 |
| 2010/0155946 A1* | 6/2010 | Lee | H01L 23/3171 257/738 |
| 2011/0193231 A1* | 8/2011 | Elenius | H01L 23/564 257/750 |

* cited by examiner

*Primary Examiner* — Shaun Campbell
*Assistant Examiner* — Aaron Dehne

(57) ABSTRACT

Integrated circuit packages with cavity are disclosed. A disclosed integrated circuit package includes a first die. A second die may be coupled to the first die by attaching the first die to a top surface of the second die. A blocking element such as a barrier structure may be formed that surrounds the second die. A cavity may be formed between the blocking element and the first die that encloses the second die. The barrier structure may help prevent underfill material from entering the cavity during underfill deposition processes. A heat spreading lid may cover the first die, second die and package substrate.

3 Claims, 5 Drawing Sheets

INTEGRATED CIRCUIT PACKAGE WITH VACANT CAVITY

BACKGROUND

As demand for high performance integrated circuit devices grows, more and more components are placed in a single integrated circuit package. To reduce device size and cost, components may be stacked on top of each other or placed closer to each other on printed circuit boards to improve device functionality and performance. For example, multiple dies may be stacked on top of each other in a single integrated circuit package.

During manufacturing, underfill and molding compounds may be added to the package to increase the package's structural stability. However, different package materials have different mechanical properties, such as different coefficients of thermal expansion (CTE). When an underfill material is dispensed between the components in the package, the underfill capillary flow may increase mechanical stress in the package, which may lead to a delamination problem between integrated circuit components with different CTE values.

SUMMARY

In accordance with the present invention, apparatuses and methods are provided for creating an integrated circuit package with improved mechanical stress resistance.

It is appreciated that the present invention can be implemented in numerous ways, such as a process, an apparatus, a system, or a device. Several inventive embodiments of the present invention are described below.

A method for packaging integrated circuits is disclosed. The method may include attaching a first integrated circuit die to a top surface of a second integrated circuit die to form an integrated circuit package. A barrier may be formed surrounding the second integrated circuit die to create a cavity devoid of any underfill material. The barrier prevents underfill material from entering the cavity during depositing operations.

An integrated circuit package is disclosed. The integrated circuit package includes a substrate, a first die mounted on the substrate, and a second die that is interposed between the first die and the substrate. The integrated circuit package further includes a barrier structure beneath the first die that surrounds the second die to create a cavity devoid of any underfill material.

Another integrated circuit package is disclosed. The integrated circuit package includes a first die attached to a second die to form a die stack structure. The die stack structure may be mounted on a substrate. A cavity may be subsequently formed between the substrate and the first die. The cavity may also surround the second die.

Further features of the invention, its nature and various advantages, will be more apparent from the accompanying drawings and the following detailed description of the preferred embodiments.

DETAILED DESCRIPTION

The embodiments provided herein include integrated circuit structures and packaging techniques for improved mechanical stress resistance.

It will be obvious, however, to one skilled in the art, that the present exemplary embodiments may be practiced without some or all of these specific details. In other instances, well-known operations have not been described in detail in order not to obscure unnecessarily the present embodiments.

Figure 1:
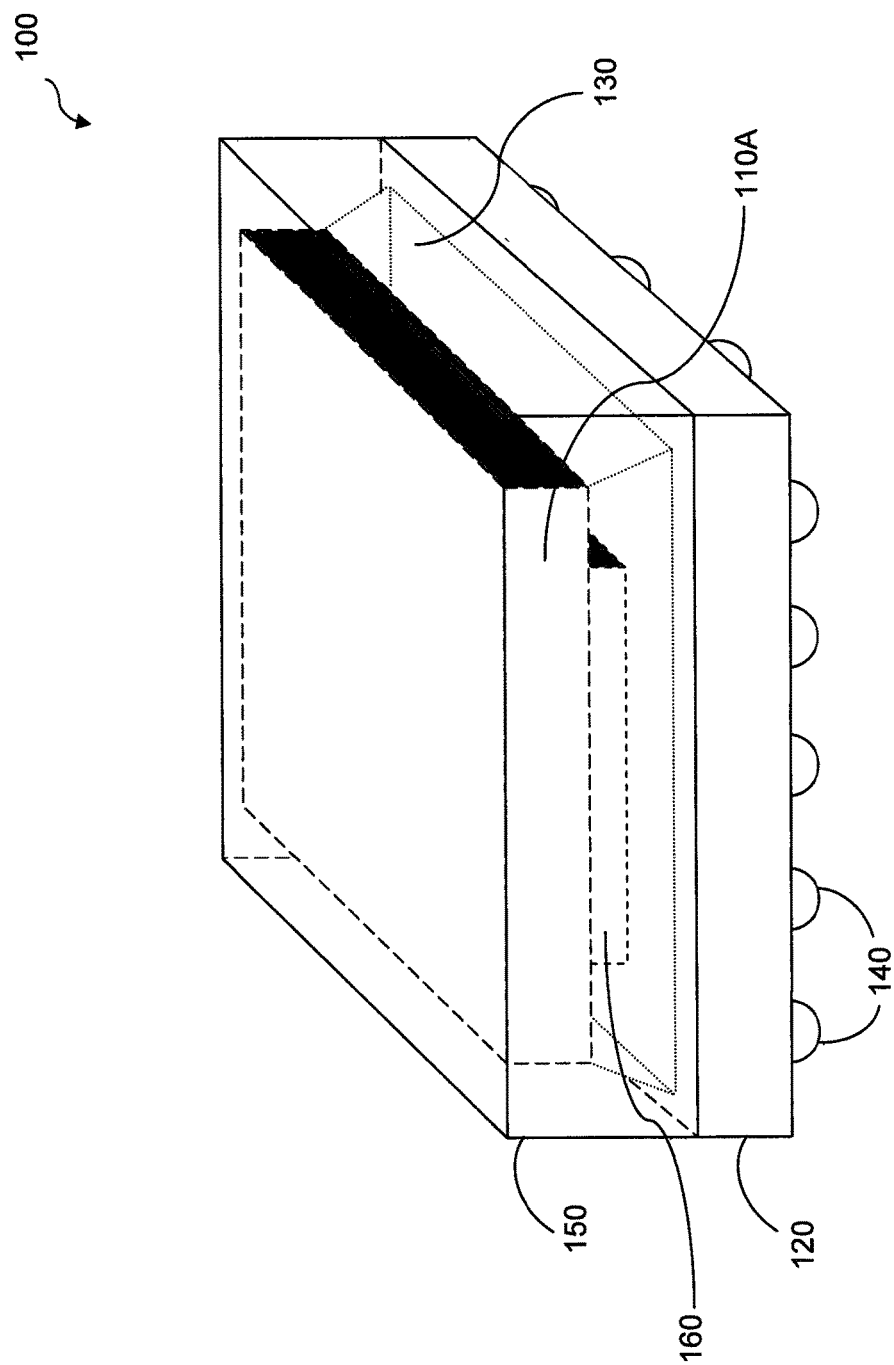
FIG. 1 is an isometric view of an illustrative integrated circuit package with two dies and a package substrate in accordance with an embodiment of the present invention.

FIG. 1 is an isometric view of an illustrative integrated circuit package 100 with die 110A, barrier structure 160 and package substrate 120 in accordance with an embodiment of the present invention. In the embodiment of FIG. 1, a first die (e.g., die 110A) may disposed on the top surface of a second die (not shown in the figure) to form a die stack structure. Barrier structure 160 is formed by depositing a barrier material (e.g., resin) on package substrate 120 such that a cavity (not shown in the figure) is formed between die 110A and package substrate 120, and the second die is placed within the cavity. Barrier structure 160 and the cavity will be further described in connection with integrated circuit package 200 of FIG. 2.

Underfill material 130 such as epoxy may be deposited into the remaining space (or "gap") between the die stack structure and substrate 120. Heat spreading lid 150 may be disposed over package substrate 120 and the die stack structure to allow heat to escape from integrated circuit package 100. Heat spreading lid 150 substantially covers the die stack structure and a top surface of package substrate 120, which may help to protect the die stack structure from external contaminants. Solder bumps or balls 140, disposed on the bottom surface of package substrate 120, may be used to connect integrated circuit package 100 to external circuitry.

Figure 2:
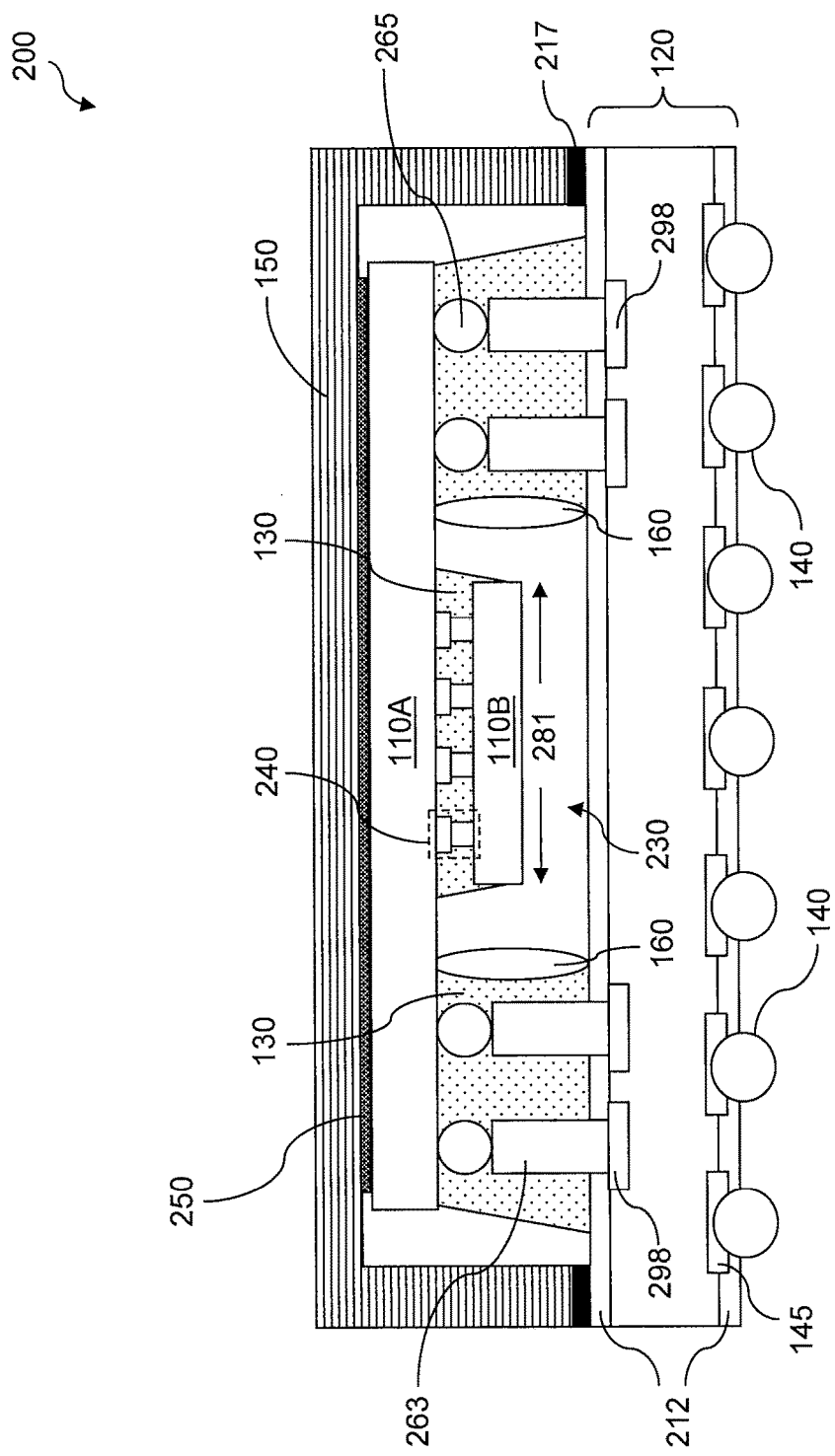
FIG. 2 is a cross-sectional side view of an illustrative integrated circuit package having a cavity formed between the package substrate and a first die, and a second die placed within the cavity in accordance with an embodiment of the present invention.

FIG. 2 is a side view of an illustrative integrated circuit package 200 with cavity 230 formed between package substrate 120 and die 110A. As shown in FIG. 2, die 110B is located within cavity 230. It should be appreciated that integrated circuit package 200 may share similarities with integrated circuit package 100 of FIG. 1. As such, for the sake of brevity, elements that have been described above, such as heat spreading lid 150 and solder bumps or balls 140, will not be described in detail.

Package 200 may be a three-dimensional (3D) package in which integrated circuit dies 110B and 110A are stacked. As shown in the example of FIG. 2, integrated circuit package 200 includes die 110B stacked on die 110A. Die 110A is electrically coupled to die 110B via support members 240. In one embodiment, support members 240 acts as a communication pathway between die 110A and die 110B. Signals from die 110A may be conveyed to die 110B by support members 240. It should be appreciated that a variety of support members 240 and 263 having different configurations may be employed in this context. For instance, support members 240 and 263 may be solder bumps or balls.

As shown in FIG. 2, the remaining portions of die 110A (e.g., the area of die 110 that is not attached to die 110B) may be bonded directly to package substrate 120. Die 110A may be formed with solder bumps 265 that are affixed to I/O bonding pads (not shown) on the front surface of die 110A. During packaging assembly, die 110A is "flipped" onto its front surface (e.g., the bottom surface as shown in FIG. 2 and the active circuit surface) so that the solder bumps 265 form electrical and mechanical connections directly between die 110A and contact pads 298 on package substrate 120. Die 110A is also mechanically coupled to package substrate 120 through support members 263. Support members 263 may enhance joint support between die 110A and package substrate 120. Signals from die 110A may travel to package substrate 120 through support members 263 and solder bumps 265. As an example, support members 263 may be copper posts.

A thermally conductive material may be placed on heat-generating integrated circuit components such as dies 110A and 110B to facilitate heat transfer. In the example of FIG. 2, thermally conductive material 250 is placed on a top surface of die 110A. Thermally conductive material 250 may also be used to fill the gap between die 110A and heat spreading lid 150 to increase thermal transfer efficiency. As an example, thermally conductive material 250 may be a thermal interface material (TIM).

Surface delamination may be caused by shear stress 281 in a stacked die structure (e.g., die 110A is stacked on die 110B) when underfill material 130 is disposed on substrate 120 due to different coefficients of thermal expansion (CTE). In one embodiment, barrier structure 160 is formed on package substrate 120 such that cavity 230 is formed between package substrate 120, barrier structure 160 and die 110A, with die 110B enclosed within cavity 230. In an alternate embodiment, barrier material 160 is inked or deposited on die 110A to form cavity 230 between die 110A and package substrate 120. For example, barrier structure 160 may be an electrolytic-plated barrier structure. Barrier structure 160 helps to prevent underfill material 130 from entering cavity 230. As such, underfill material 130 is not present at the bottom surface of die 110B and therefore thermal expansion of die 281 is not impeded. This may help reduce shear stress 281 on the surfaces of dies 110A-110B and package substrate 120.

Package substrate 120 further includes one or more layers of build-up film 212 that may cover the top and/or the bottom surface of package substrate 120. In one embodiment, build-up film 212 includes solder-resist ink. Heat spreading lid 150 is attached to package substrate 120 through adhesive 217. Adhesive 217 may be an epoxy in the form of paste or glue or may be any desired adhesive materials. Contact pads 145 on the bottom surface of package substrate 120 may be coupled to solder bumps or balls 140 to transmit signals out of integrated circuit package 200. As an example, contact pads 145 may be formed by depositing copper or other conductive materials to form contacts on the bottom surface of package substrate 120.

Figure 3:
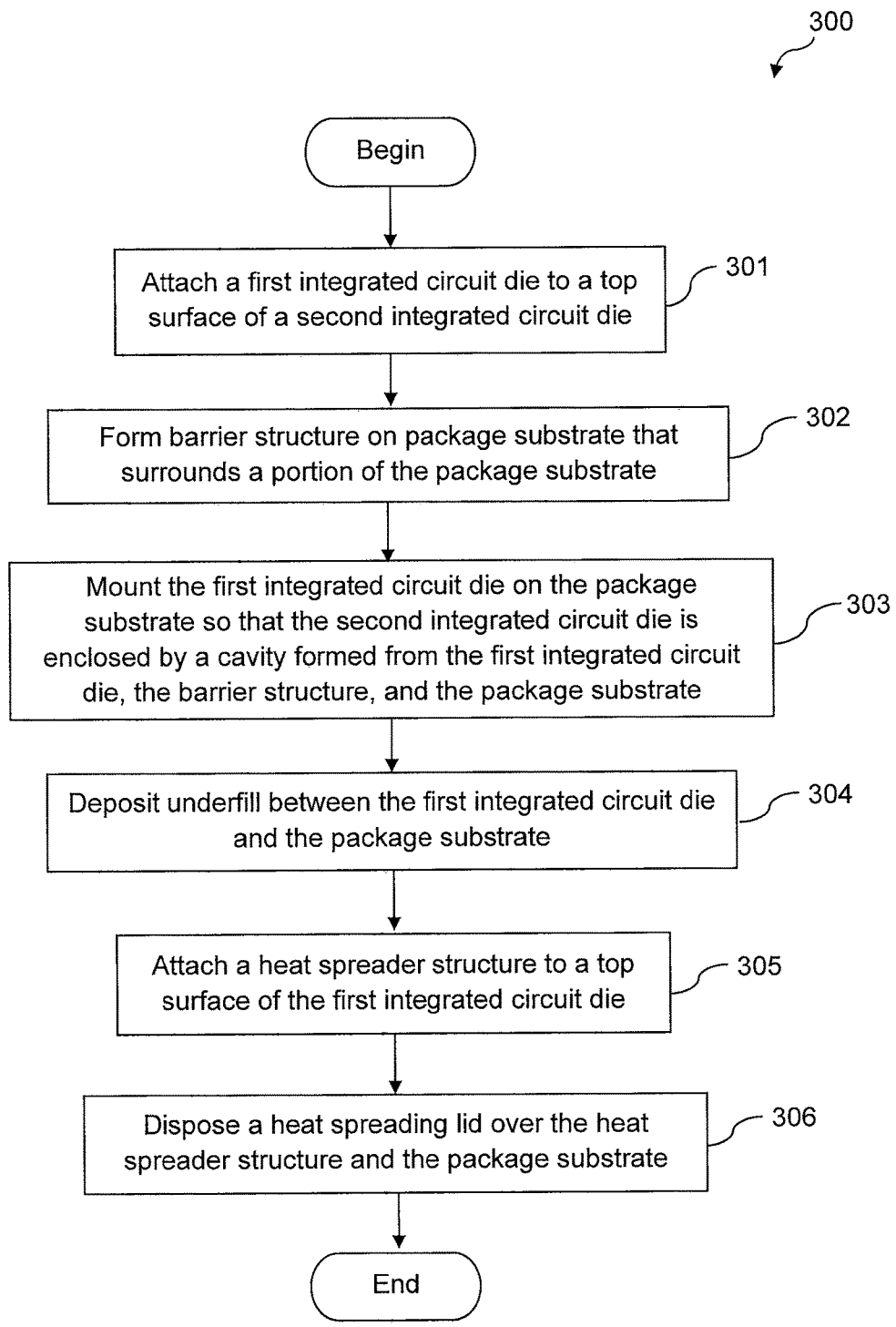
FIG. 3 is a flowchart of illustrative steps that may be performed using manufacturing equipment to manufacture an integrated circuit package having a single barrier structure in accordance with an embodiment of the present invention.

FIG. 3 is a flowchart of illustrative steps that may be performed using manufacturing equipment to manufacture an integrated circuit package having a single barrier structure in accordance with an embodiment of the present invention. At step 301, a first integrated circuit die is attached to a top surface of a second integrated circuit die. In an exemplary embodiment, a plurality of support members (e.g., support members 240 of FIG. 2) may be attached between the second integrated circuit die and the first integrated circuit die. For example, in the embodiment of FIG. 2, die 110A is electrically coupled to die 110B through support members 240. In another example, support members 240 may include microbumps.

At step 302, a barrier structure is formed on a package substrate that surrounds a portion of the package substrate. In the embodiment shown in FIG. 2, a barrier material is dispensed on package substrate 120 such that barrier structure 160 is formed between package substrate 120 and die 110A that surrounds die 110B. For example, the barrier material may resin or any thermoset material.

At step 303, the first integrated circuit die is mounted on the package substrate so that the second integrated circuit die is enclosed by a cavity formed from the first integrated circuit die, the barrier structure, and the package substrate. As shown in FIG. 2, die 110A may be coupled (electrically or mechanically) to package substrate 120 through support members 263, solder bumps 265 and contact pads 298. Accordingly, barrier structure 160 may be attached to die 110A, which forms cavity 230. In one embodiment, cavity 230 encloses die 110B.

At step 304, the underfill material is deposited between the first integrated circuit die and the package substrate. As shown in FIG. 2, underfill material 130 is deposited into the remaining gap between die 110A and package substrate 120. Barrier material 160 acts as a blockade to prevent underfill material 130 from flowing into cavity 230 such that shear stress (e.g., shear stress 281) on the surfaces of dies 110A-110B and package substrate 120 can be minimized.

At step 305, a heat spreader structure is attached to a top surface of the first integrated circuit die. The heat spreader structure may dissipate heat generated by the first integrated circuit die. For example, as shown in FIG. 2, heat spreader structure such as thermally conductive material 250 may dissipate heat generated by die 110A.

A heat spreading lid may be disposed over the heat spreader structure and the package substrate at step 306. As shown in FIGS. 1 and 2, heat spreading lid 150 may be placed on top of thermally conductive material 250 over package substrate 120. Heat spreading lid 150 may cover dies 110A-110B and a top surface of package substrate 120 to protect dies 110A-110B from physical damage. It should be appreciated that heat spreading lid 150 may be made of a thermally conductive material in order to effectively transfer heat generated by integrated circuit components (e.g., die 110A, die 110B, etc.) out of integrated circuit packages 100 and 200.

Figure 4:
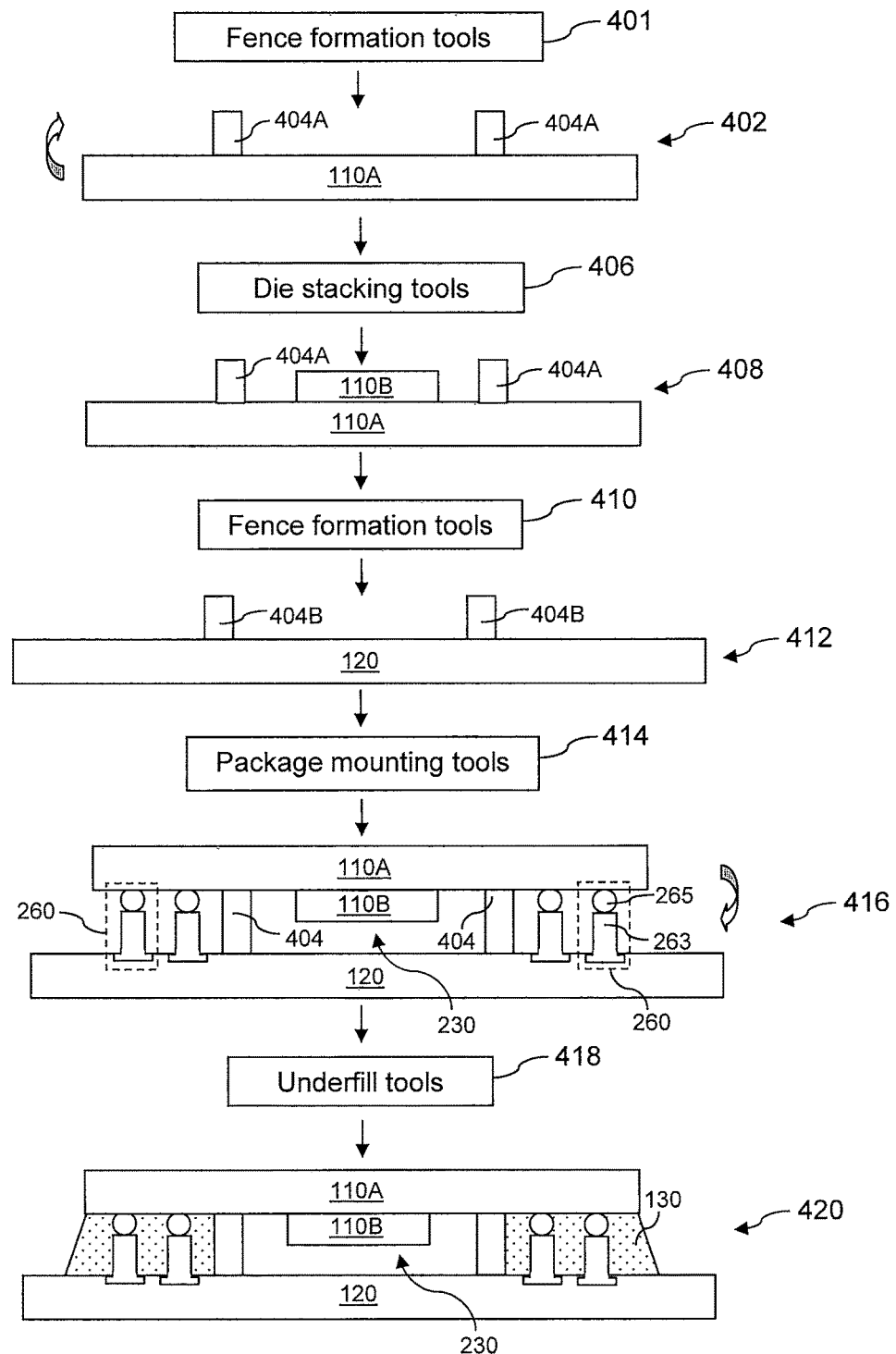
FIG. 4 is an illustrative flow diagram of a manufacturing process for packaging integrated circuits in accordance with an embodiment of the present invention.

FIG. 4 is an illustrative flow diagram for a manufacturing process for packaging integrated circuits in accordance with an embodiment of the present invention. As shown in step 402, barrier material 404A such as resin may be formed or deposited on an active surface of die 110A such that a barrier structure or fence is formed. For example, the active surface of die 110A may be a front surface of die 110A. In order to form a barrier structure on die 110A, die 110A may be flipped or turned over such that the front surface (or the active surface) of die 110A faces upwards as shown in step 402. This way, barrier material 404A can be easily formed on die 110A. In one embodiment, barrier material 404A may be formed or deposited on die 110A using fence formation tools 401. For example, fence formation tools 401 may include an electroplating tool or a resin deposition tool.

Another die may be attached on the active surface of die 110A. In one embodiment, die 110B may be stacked on the active surface of die 110A that has been flipped over at step 402. As shown in step 408, die 110B may be stacked on die 110A using die stacking tools 406. Die 110B may also be electrically coupled to die 110A via support members (e.g., support members 240 of FIG. 2). The support members may also include microbumps.

At step 412, barrier material 404B may be deposited on package substrate 120. It should be appreciated barrier materials 404A and 404B may be made from the same material. In one embodiment, the deposition of barrier materials 404A-404B may be selected from the group that includes resin, thermoset material, solder resist, and metal. It should be appreciated that the deposition method of barrier material 404B in step 412 may be similar to the deposition method of barrier material 404A in step 402.

The stacked dies shown in step 408 may be flipped over such that barrier material 404A on die 110A attaches to barrier material 404B on package substrate 120 at 416. By mating barrier material 404A to barrier material 404B, a fence or barrier structure 404 may be formed surrounding die 110B. It should be appreciated that the material of barrier structure 404 may be similar to barrier structure 160 of FIG. 2. Cavity 230 may be formed as a result of the mating of barrier materials 404A (shown in step 402) and 404B (shown in step 412). In an alternate embodiment, barrier material 404 may be built entirely on die 110A or package substrate 120. Cavity 230 may be formed by attaching barrier material 404A to package substrate 120 or die 110A, respectively.

Die 110 may be coupled to package substrate 120 via support members 263. In one embodiment, support members 263 may provide a mechanical support between for 110A. Support members 263 may also electrically couple die 110A to package substrate 120 through solder bumps 265 and contact pads 298. For example, support members 263 may be copper posts.

During an assembly process, underfill material 130 may be applied to an integrated circuit package (e.g., integrated circuit package 200 of FIG. 2). The capillary action of underfill material 130 may draw the underfill to fill up the remaining space or "gap" between die 110A and package substrate 120. By forming barrier structure 404 in the integrated circuit package, underfill material 130 may be prevented from entering cavity 230, thereby minimizing the shear stress (e.g., shear stress 281 of FIG. 2) on the respective surfaces of dies 110A-110B and package substrate 120. For example, as shown in 420, when underfill material 130 is dispensed in between die 110A and package substrate 120 at 420, barrier structure 404 may block underfill material 130 from entering cavity 230. Tools for dispensing or deposit underfill material such as underfill tools 518 may be used to deposit underfill material 130 such as epoxy resin.

Figure 5:
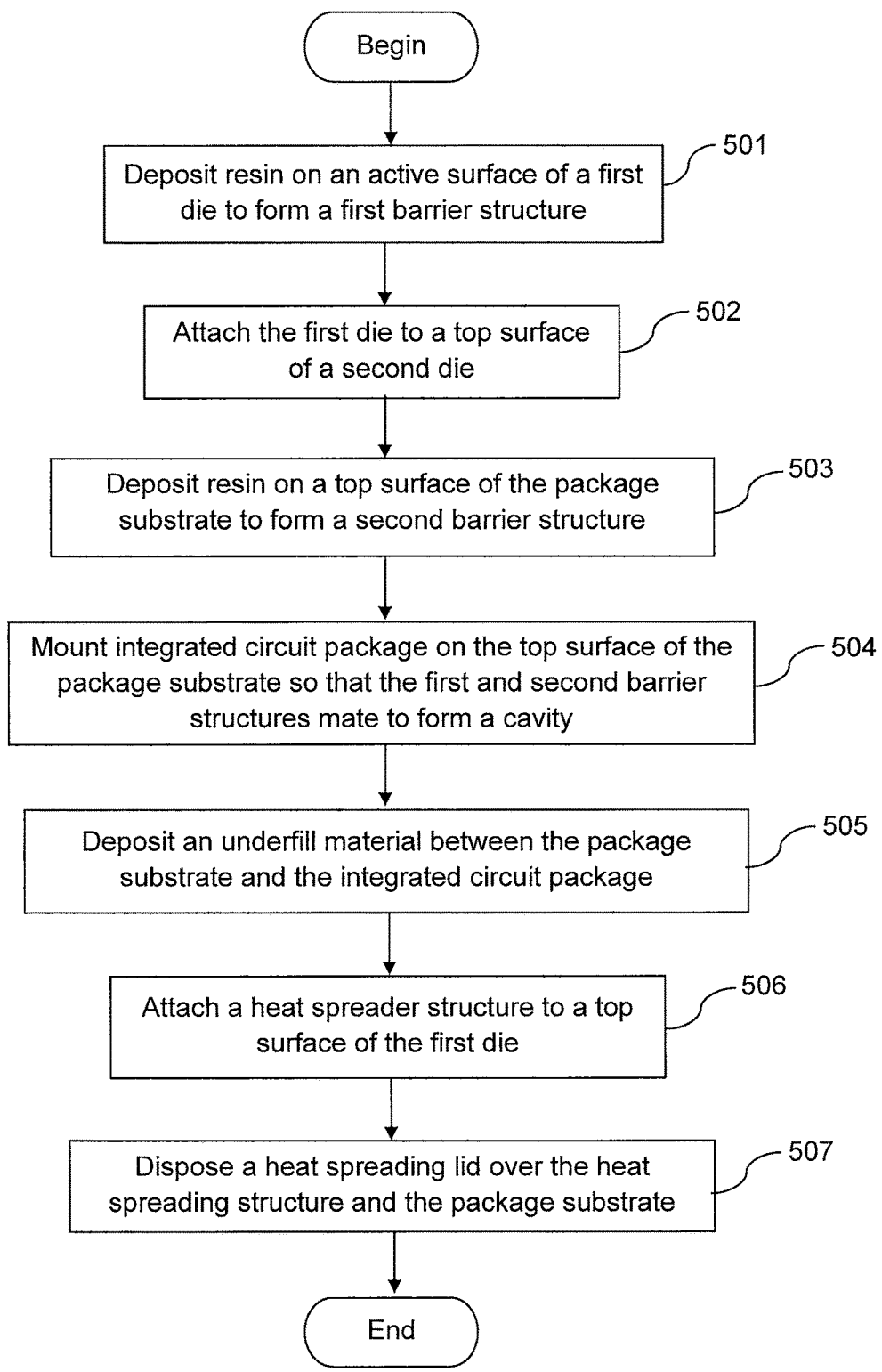
FIG. 5 is an illustrative flowchart of a method of manufacturing an integrated circuit package having opposing barrier structures that mate in accordance with an embodiment of the present invention.

FIG. 5 is an illustrative flowchart for a method of manufacturing an integrated circuit package having opposing barrier structures that mate in accordance with an embodiment of the present invention. At step 501, resin is deposited on an active surface of a first die to form a first barrier structure. As shown in 402 of FIG. 4, the resin may be deposited on the active side of die 110A that has been flipped over such that the active side of die 110A faces upwards to accommodate resin deposition.

The first die may be subsequently attached to a top surface of a second die at step 502. As shown in FIG. 2, die 110A may be attached to the top surface of die 110B through support members 240. Support members 240 may form signal pathways for signal transmission between die 110A and die 110B. For example, support members 240, such as copper pillars, may electrically couple die 110A and die 110B. In another example, support members 240 may be solder bumps or balls. Solder bumps or ball may form electrical connection between die 110A and die 110B.

At step 503, resin may be deposited on a top surface of a package substrate to form a second barrier structure. It should be appreciated that the resin may be similar to barrier material 404B of FIG. 4. If desired, thermoset material, solder resist, or metal may also be used to form the second barrier structure.

Potential interfacial shear stress between the first and second dies may be reduced by creating a cavity inside the integrated circuit package. At step 504, the integrated circuit package may be mounted on the top surface of the package substrate so that the first and second barrier structures mate to form the cavity. For example, as shown in FIG. 4, the mating of barrier material 404A and barrier material 404B that are deposited on the top surface of die 110A and the bottom surface of package substrate 120, respectively, may form a barrier structure that surrounds die 110B (e.g., barrier structure 160 of FIG. 2). The shape of the deposited second barrier structure may be similar to the first barrier structure such that the second barrier structure fits the first barrier structure during mating.

At step 505, an underfill material may be deposited between the package substrate and the integrated circuit package. For example, underfill material 130 of FIGS. 1, 2 and 4 may be dispensed between package substrate 120 and die 110A. The presence of barrier structure 160 of FIG. 2 prevents underfill material 130 from entering the cavity.

At step 506, a heat spreader structure is attached to a top surface of the first die. In the embodiment of FIG. 2, the heat spreader structure may include thermally conductive material 250. The thermally conductive material 250 of FIG. 2 may be configured to have a uniform thickness to facilitate heat transfer from die 110A.

A heat spreading lid may be placed over the heat spreader structure and the package substrate at step 607. In the embodiment of FIG. 1, heat spreading lid 150 may be placed on top of thermally conductive material 250 of FIG. 2 over package substrate 120. Adhesive 217 of FIG. 2 may be used to connect heat spreading lid 150 to package substrate 120.

The method and apparatus described herein may be incorporated into any suitable circuit. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A method for packaging integrated circuits on a package substrate, the method comprising:
    attaching a first integrated circuit die to a top surface of a second integrated circuit die to form an integrated circuit package;
    depositing underfill material between the first integrated circuit die and the second integrated circuit die; and
    forming a cavity that allows for thermal expansion of the second integrated circuit die within the cavity, wherein forming the cavity comprises:
        forming a first barrier structure on a bottom surface of the first integrated circuit die, wherein the first barrier structure protrudes from the bottom surface of the first integrated circuit die;
        forming a second barrier structure on a top surface of the package substrate, wherein the first barrier structure protrudes from the top surface of the package substrate, and wherein the first barrier structure and the second barrier structure are formed from metal; and
        mounting the integrated circuit package on the top surface of the package substrate so that the first and second barrier structures mate to form the cavity.

2. The method defined in claim 1 further comprising:
    depositing additional underfill material between the package substrate and the integrated circuit package, wherein the first and second barrier structures prevent the additional underfill material from entering the cavity.

3. The method defined in claim 1 further comprising:
    disposing a heat spreading lid over the first and second integrated circuit dies and the package substrate.

* * * * *